United States Patent [19]

Hamada

[11] Patent Number: 5,453,876
[45] Date of Patent: Sep. 26, 1995

[54] MICROLENS ARRAY

[75] Inventor: Hiroshi Hamada, Nara, Japan

[73] Assignee: Sharp Kabushiki Kaisha, Osaka, Japan

[21] Appl. No.: 869,910

[22] Filed: Apr. 15, 1992

Related U.S. Application Data

[63] Continuation of Ser. No. 400,534, Aug. 30, 1989, abandoned.

[30] Foreign Application Priority Data

Aug. 30, 1988 [JP] Japan ................................. 63-218187

[51] Int. Cl.$^6$ ................................................ G02B 27/10
[52] U.S. Cl. ........................ 359/625; 359/455; 359/626; 359/738
[58] Field of Search ................... 350/167, 417; 359/450, 455, 619, 620, 621, 622, 623, 624, 625, 626, 664, 708, 710, 737, 738

[56] References Cited

U.S. PATENT DOCUMENTS

| | | | |
|---|---|---|---|
| 3,879,110 | 4/1975 | Furukawa et al. | |
| 4,509,824 | 4/1985 | Yamasaki et al. | 350/417 |
| 4,567,123 | 1/1986 | Ohtaka et al. | 350/417 |
| 4,689,291 | 8/1987 | Popovic et al. | 350/417 |
| 4,783,141 | 11/1988 | Baba et al. | 350/167 |
| 4,877,717 | 10/1989 | Suzuki et al. | 350/167 |
| 4,882,262 | 11/1989 | Wilwerding | 350/167 |
| 5,216,543 | 6/1993 | Calhoun | 359/619 |

FOREIGN PATENT DOCUMENTS

| | | | |
|---|---|---|---|
| 0027647 | 3/1977 | Japan | 350/167 |
| 0250401 | 10/1987 | Japan | 350/417 |

OTHER PUBLICATIONS

Suzuki et al., *Conference on Lasers and Electro Optics* (29 Apr. 1988) p. WJ5.
English Abstract corresponding to Japanese Laid-Open Patent Nos. 60-165621, 60-165622, 60-165623, 60-16524, Aug. 28, 1985.
English Abstract corresponding to Japanese Laid-Open Patent No. 60-262131 Dec. 25, 1985.
English Abstract corresponding to Japanese Laid-Open Patent No. 54-17620 Sep. 2, 1979.
English Abstract corresponding to Japanese Laid-Open Patent No. 57-9280 Jan. 18, 1982.
English Abstract corresponding to Japanese Laid-Open Patent No. 63-44624 Feb. 25, 1988.
English Abstract corresponding to Japanese Laid-Open Patent No. 61-67003 Apr. 7, 1986.
English Abstract corresponding Japanese Laid-Open Patent No. 61-153602 Jul. 12, 1986.
English Abstract Corresponding to Japanese Laid-Open Patent No. 60-72927 Apr. 25, 1985.
English Abstract corresponding to Japanese Laid-Open Patent No. 60-166946 Aug. 30, 1985.
English Abstrct corresponding to Japanese Laid-Open Patent No. 60-38989 Feb. 28, 1985.
M. Oikawa et al., Electronics Letters, vol. 17, No. 13, pp. 452-454 Jun. 25, 1981.
N. F. Borrelli et al., Applied Optics, vol. 24, No. 16, pp. 2520-2525.

*Primary Examiner*—Georgia Y. Epps
*Assistant Examiner*—Thomas Robbins
*Attorney, Agent, or Firm*—Morrison & Foerster

[57] ABSTRACT

A microlens array is disclosed which comprises a supporting substrate, a light condensing layer having a plurality of microlenses, and a shading layer having a plurality of openings, each of the microlenses being formed so as to condense light through the corresponding opening of the shading layer, wherein the light condensing layer is formed by exposing a photosensitive resin layer to light with the use of the shading layer as a mask, the photosensitive resin layer being formed on the supporting substrate together with the shading layer.

4 Claims, 5 Drawing Sheets

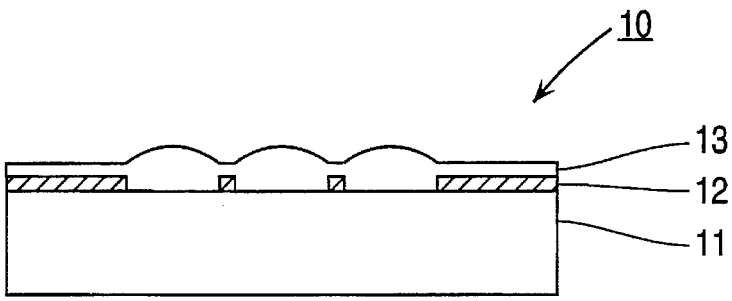
FIG. 1a
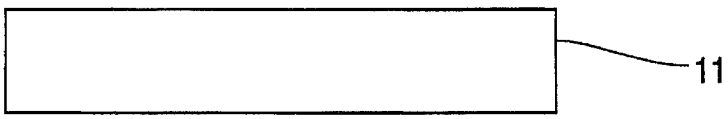
FIG. 1b
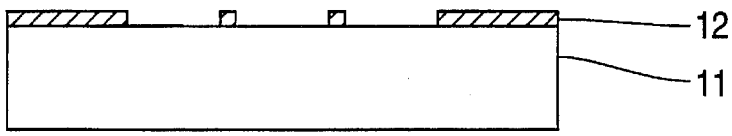
FIG. 1c
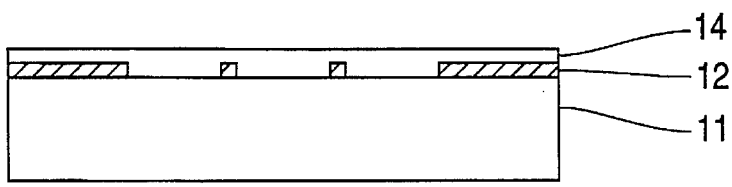
FIG. 1d
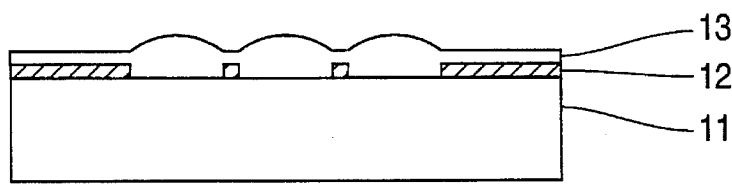
FIG. 1e
EXPOSURE

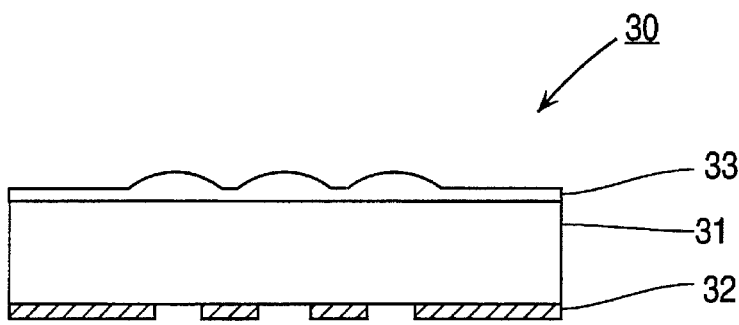
FIG. 3a
FIG. 3b
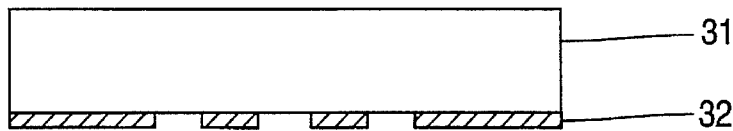
FIG. 3c
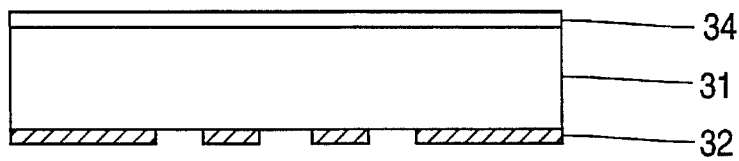
FIG. 3d
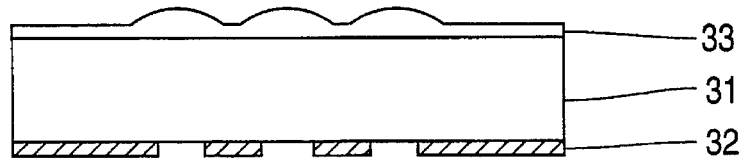
FIG. 3e
EXPOSURE

MICROLENS ARRAY

This application is a continuation of application Ser. No. 400,534, filed August, 1989, now abandoned.

BACKGROUND OF THE INVENTION

1. Field of the Invention

This invention relates to a microlens array comprising a plurality of microlenses disposed regularly in a linear or planar arrangement and it also relates to a method for producing the same.

The microlens array of this invention can be used in the following applications i–iii.

(i) A means for condensing illuminating light on the picture element regions of a nonluminescent display device such as a liquid crystal display device to increase the brightness of the display (see, e.g., Japanese Laid-Open Patent Publications No. 60-165621, No. 60-165622, No. 60-165623, No. 60-165624, and No. 60-262131).

(ii) A means for condensing incident light or a means for forming an image, on the photoelectric conversion regions of a solid-state image sensing device such as a charge coupled device (CCD) or of a line image sensor used in facsimiles and the like to improve the sensitivity of these devices (see, Japanese Laid-Open Patent Publications No. 54-17620 and No. 57-9280).

(iii) A means for forming an image to be printed, on a photosensitive means used in liquid crystal printers or light emitting diode (LED) printers (see, e. g., Japanese Laid-Open Patent Publication No. 63-44624).

2. Description of the Prior Art

A conventional microlens array can be formed by any one of the following methods 1–7.

(1) A method for forming a plastic or glass material by the use of a mold.

(2) A method for forming convex lenses on the basis of a phenomenon in which when a photosensitive resin is exposed to light in a desired pattern by the use of an aligner, unreacted monomers move from the unexposed regions to the exposed regions, resulting in a swell of the exposed regions (see, e.g., Journal of the Research Group in Microoptics Japanese Society of Applied Physics, Colloquium in Optics, Vol. 5, No. 2, pp. 118–123 (1987) and Vol. 6, No. 2, pp. 87–92 (1988)).

FIG. 4a shows a conventional microlens array 40 produced by this method. The microlens array 40 consists of a supporting substrate 41 and a light condensing layer 42 having a plurality of microlenses, disposed thereon. This microlens array is produced as follows.

First, as shown in FIG. 4b, the supporting substrate 41 is provided to support the light condensing layer 42 having the microlenses. Then on the upper surface of the supporting substrate 41, a photosensitive resin layer 43 is formed as shown in FIG. 4c. Thereafter, with the use of a separate shading mask 44, the upper surface of the photosensitive resin layer 43 is illuminated with light from a mercury lamp or the like, so that the photosensitive resin layer 43 is exposed to the light. As a result, the exposed portions of the photosensitive resin layer 43 swell into the shape of convex lenses as shown in FIG. 4d, to form the light condensing layer 42 having a plurality of microlenses. In this way, the conventional microlens array 40 is obtained which is shown in FIG. 4a.

(3) A method for obtaining convex lenses wherein a pattern of the lenses in a planar configuration is drawn on a thermoplastic resin by a conventional photolithographic technique or the like, and then the thermoplastic resin is heated to a temperature above the softening point of this resin to have flowability, thereby causing a sag in the pattern edge (see, e.g., Japanese Laid-Open Patent Publications No. 60-38989, No. 60-165623, and No. 61-67003). In this method, when the thermoplastic resin used has a photosensitivity, a pattern of the lenses can be obtained by exposure of this resin to light.

(4) A method for obtaining convex lenses wherein a photosensitive resin is exposed to light by a proximity exposure technique in which a photomask is not brought into contact with the resin, to cause a blur at the pattern edge, so that the amount of photochemical reaction products is distributed depending upon the degree of blurring at the pattern edge (see, e.g., Japanese Laid-Open Patent Publication No. 61-153602).

(5) A method for generating a lens effect wherein a photosensitive resin is exposed to light with a particular intensity distribution to form a distribution pattern of refractive index depending upon the light intensity (see, e.g., Japanese Laid-Open Patent Publications No. 60-72927 and No. 60-166946).

(6) A method for obtaining distributed index lenses by a selective ion diffusion, wherein a glass plate which serves as a substrate is immersed in a molten salt to cause an exchange of a different kind of alkali ions or the like between the glass plate and the molten salt through a mask disposed on the glass plate, thereby yielding a glass plate with a distribution of refractive index corresponding to the mask pattern (see, e.g. , Electronics Letters, Vol. 17, No. 18, p. 452 (1981)).

(7) A method for obtaining convex lenses by the use of a contraction accompanying the crystallization of a photosensitive glass caused by illuminating the glass (see, e.g., Applied Optics, Vol. 24, No. 16, p. 2520 (1985)). This method is based on the following principle: When a glass plate which has been coated with a silver salt to have a photosensitivity is exposed to light, silver atoms are liberated to form a latent image made of crystal nuclei. This glass plate is then heated to crystallize around the crystal nuclei, thereby causing a decrease in its volume. When the glass plate is exposed to light with an intensity distribution of a particular pattern, the exposed portions of the glass plate contract, but the unexposed portions do not contract and therefore are left to form relatively protuberant portions, resulting in a configuration of convex lenses through surface tension.

In a microlens array made by any one of the above-mentioned methods 1–7, a separate shading mask must be provided to prevent the adverse effects of stray light (undesirable light) on the display characteristics, such as a decrease in contrast. However, this arrangement introduces another problem of having a deviation between the position of the microlens array and the corresponding position of the shading mask, which causes a decrease in the availability of incident light, resulting in degradation of the display characteristics.

Moreover, method 1 above is limited due to the inability of machines to process a mold with high density and high dimensional accuracy. Also methods 6 and 7 cannot provide a high reliability in the dimensional accuracy for practical applications, because glass materials are treated at high temperatures.

SUMMARY OF THE INVENTION

The microlens array of this invention, which overcomes the above-discussed and numerous other disadvantages and deficiencies of the prior art, comprises a supporting substrate, a light condensing layer having a plurality of microlenses, and a shading layer having a plurality of openings, each of said microlenses being formed so as to condense light through the corresponding opening of said shading layer, wherein said light condensing layer is formed by exposing a photosensitive resin layer to light with the use of said shading layer as a mask, said photosensitive resin layer being formed on said supporting substrate together with said shading layer.

In a preferred embodiment, wherein the shading layer is disposed on said supporting substrate and said light condensing layer is disposed on said shading layer.

In a preferred embodiment, wherein the light condensing layer is disposed on said supporting substrate and said shading layer is disposed on said light condensing layer.

In a preferred embodiment, wherein the light condensing layer is disposed on one surface of said supporting substrate and said shading layer is disposed on the other surface of said supporting substrate.

In a preferred embodiment, wherein the microlenses are those selected from the group consisting of spherical lenses, cylindrical lenses, lenticular lenses, rectangular lenses, and hexagonal lenses.

A method for preparing a microlens array of this invention comprises the steps of: forming a shading layer having a plurality of openings on a supporting substrate; forming a photosensitive resin layer on said supporting substrate including said shading layer; and exposing said photosensitive resin layer to light with the use of said shading layer as a mask, to form a light condensing layer having a plurality of microlenses.

In a preferred embodiment, the abovementioned method further comprises the step of exposing said light condensing layer to light, to react the unreacted resin remaining therein.

Another method for preparing a microlens array of this invention comprises the steps of: forming a photosensitive resin layer on a supporting substrate; forming a shading layer having a plurality of openings on said photosensitive layer; and exposing said photosensitive resin layer to light with the use of said shading layer as a mask, to form a light condensing layer having a plurality of microlenses.

In a preferred embodiment, the above-mentioned method further comprises the step of exposing said light condensing layer to light, to react the unreacted resin remaining therein.

Still another method for preparing a microlens array of this invention comprises the steps of: forming a shading layer on one surface of a supporting substrate; forming a supporting substrate; forming a photosensitive resin layer on the other surface of said supporting substrate; and exposing said photosensitive resin layer to light with the use of said shading layer as a mask, to form a light condensing layer having a plurality of microlenses.

In a preferred embodiment, the abovementioned method further comprises the step of exposing said light condensing layer to light, to react the unreacted resin remaining therein.

Thus, the invention described herein makes possible the objectives of (1) providing a method for producing a microlens array in which a photosensitive resin layer and a shading layer of a specific pattern are formed in one piece, so that the photosensitive resin layer can be exposed to an effective light while only the stray light is shaded without causing a loss of the effective light, resulting in a microlens array with high dimensional accuracy; (2) providing a method for producing a microlens array in which each lens of the microlens array is formed in a self-alignment manner with respect to the shading layer which serves as an exposure mask, so that the positioning of the exposure mask is not required and therefore direct exposure can be performed by means of a light source such as a mercury lamp or the like without the use of relatively expensive equipment such as an aligner or the like, resulting in a microlens array with a considerably improved productivity and reduced production cost; and (3) providing a microlens array with high dimensional accuracy which can improve the performance of the equipment using the same.

BRIEF DESCRIPTION OF THE DRAWINGS

This invention may be better understood and its numerous objects and advantages will become apparent to those skilled in the art by reference to the accompanying drawings as follows:

FIG. 1a is a schematic sectional view showing a microlens array of this invention.

FIGS. 1b to 1e are schematic sectional views showing a process for producing the microlens array of FIG. 1a.

FIGS. 2b to 2e are schematic sectional views showing a process for producing the microlens array of FIG. 2a.

FIG. 3a is a schematic sectional view showing still another microlens array of this invention.

FIGS. 3b to 3e are schematic sectional views showing a process for producing the microlens array of FIG. 3a.

FIGS. 4b to 4d are schematic sectional views showing a process for producing the microlens array of FIG. 4a.

DESCRIPTION OF THE PREFERRED EMBODIMENTS

Example 1

Figure 2A:
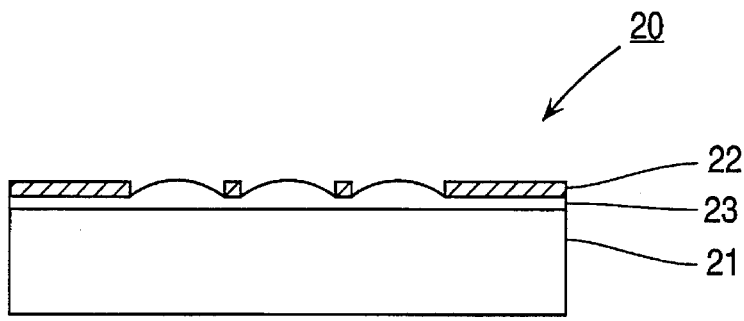
FIG. 2a is a schematic sectional view showing another microlens array of this invention.
Figure 2B:
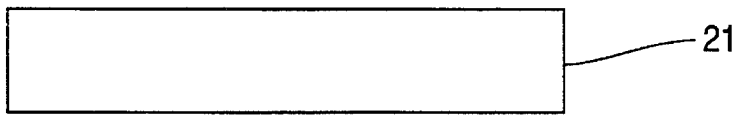
Figure 2C:

FIG. 1a shows a microlens array 10 of this invention. The microlens array 10 comprises a supporting substrate 11, a shading layer 12 disposed on the supporting substrate 11, and a light condensing layer 13 having a plurality of microlenses, disposed on the supporting substrate 11 including the shading layer 12. This microlens array is produced as follows.

First, the transparent supporting substrate 11 is provided to support the light condensing layer 12 having the microlenses, as shown in FIG. 1b. As the supporting substrate 11, a glass plate such as a quartz glass plate, a plastic plate, or the like can be used, but it is required to transmit light of a wavelength capable of causing photochemical reaction in the photosensitive resin to be described later. In this Example, a glass substrate is used that is available from Corning Corp. under the indication #7059.

Then, a thin film made of titanium (Ti) with a thickness of 1000–2000 Å is formed on the upper surface of the supporting substrate 11 by a sputtering technique. This Ti thin film is patterned by a conventional photolithographic technique, so that the shading layer 12 corresponding to the configuration of the desired microlens array is formed on the upper surface of the supporting substrate 11 as shown in FIG. 1*c*. The shading layer 12 can be made of a metal such as aluminum (Al), nickel (Ni), tantalum (Ta), molybdenum (Mo), tungsten (W), or chromium (Cr), as well as Ti mentioned above, or can be made of a compound containing at least one of these metals, such as an oxide or sulfide. As the pattern-forming method, a printing technique with various pigments, a photographic technique with silver salts, or the like can be used, as well as the above-mentioned photolithographic technique.

Next, as shown in FIG. 1*d*, a photosensitive resin layer 14 with a thickness of about 2 μ m is formed on the upper surface of the supporting substrate 11 including the shading layer 12. At this time, a cinnamic acid derivative including a cinnamic acid ester such as cinnamyl cinnamate is used as the photosensitive resin. Approximately the same amount of polymethyl methacrylate (PMMA) as that of the photosensitive resin is added thereto as a binder. This mixture is dissolved in an appropriate solvent such as dioxane or the like, and then spin-coated on the supporting substrate 11 including the shading layer 12.

Thereafter, the back surface of the supporting substrate 11 is illuminated with light from a mercury lamp, a xenon lamp, or the like for about 1 hour, so that the photosensitive resin layer 14 is exposed to the light with the use of the shading layer 12 as a mask. As a result, the exposed portions of the photosensitive resin layer 14 swell into the shape of convex lenses as shown in FIG. 1*e*, to form the light condensing layer 13 having a plurality of microlens with a focal distance of 0.72 mm and a diameter of 200 μm. Finally, the upper surface of the light condensing layer 13 is illuminated once again with light from a mercury lamp or the like, to allow the unreacted resin remaining in the light condensing layer 13 to react for stabilization.

Example 2

Figure 2D:
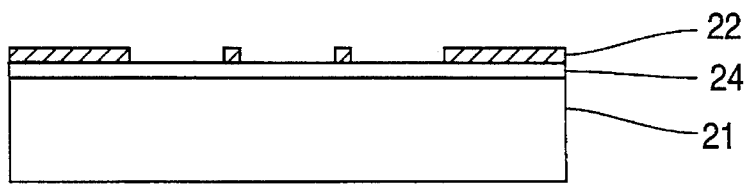
Figure 2E:
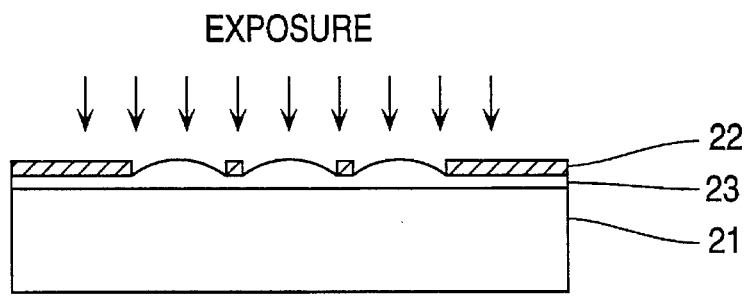
Figure 4A:
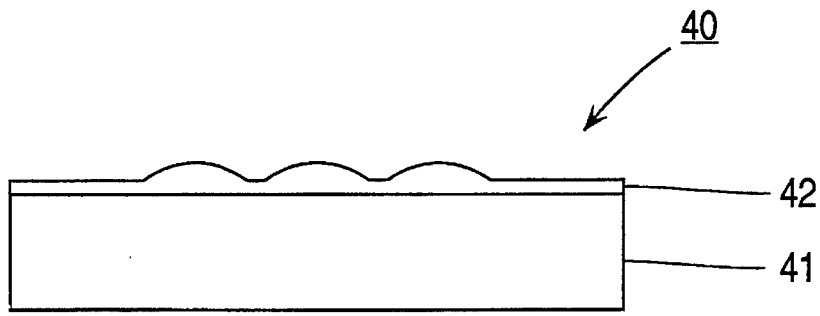
FIG. 4a is a schematic sectional view showing a conventional microlens array.
Figure 4B:
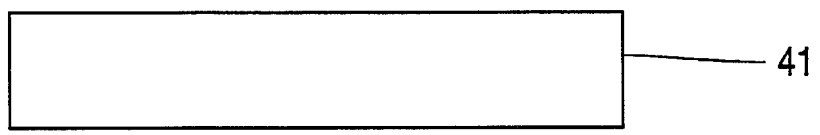
Figure 4C:
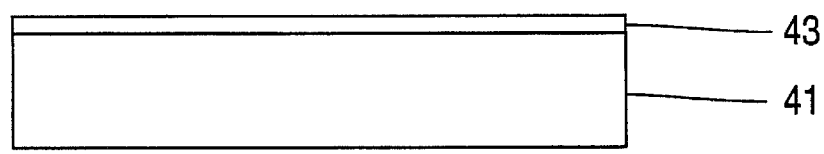
Figure 4D:
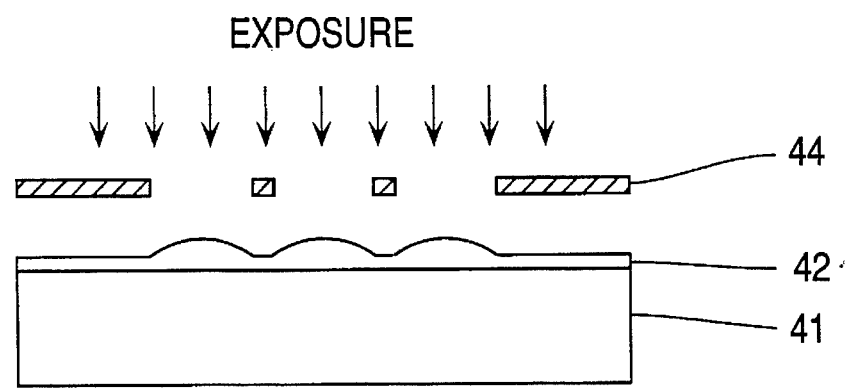

FIG. 2*a* shows another microlens array 20 of this invention. The microlens array 20 comprises a supporting substrate 21, a light condensing layer 23 disposed on the supporting substrate 21, and a shading layer 22 disposed on the light condensing layer 23. This microlens array 20 is produced in the same manner as in Example 1, except that the shading layer 22 is formed on the photosensitive resin layer 24 as shown in FIG. 2*d*. Therefore, as shown in FIG. 2*e*, when the upper surface of the supporting substrate 21, on which the photosensitive resin layer 24 and the shading layer 22 have been successively formed, is illuminated with light from a mercury lamp or the like, the photosensitive resin layer 24 is exposed to light. In this way, the microlens array 20 similar to that produced in Example 1 can be obtained as shown in FIG. 2*a*.

Although the microlens arrays 10 and 20 with a focal distance of 0.72 mm and a diameter of 200 μm are produced in the above-mentioned Examples 1 and 2, this invention is not restricted thereto. A desired microlens array can be obtained by changing the thickness of a photosensitive resin layer, the dimensions of the pattern of a shading layer, and the exposure conditions such as the exposure time.

Example 3

FIG. 3*a* shows still another microlens array 30 of this invention. The microlens array 30 comprises a supporting substrate 31, a shading layer 32 disposed on the back surface of the supporting substrate 31, and a light condensing layer 33 disposed on the upper surface of the supporting substrate 31. This microlens array 30 is produced as follows.

First, as in the case of Examples 1 and 2, the transparent supporting substrate 31 with a thickness of 1.1 mm is provided as shown in FIG. 3*b*. Then, the shading layer 32 corresponding to the configuration of the desired microlens array is formed on the back surface of the supporting substrate 31 in the same manner as that of Examples 1 and 2, as shown in FIG. 3*c*.

Next, as shown in FIG. 3*d*, the photosensitive resin layer 34 with a thickness of 3 μ is formed on the upper surface of the supporting substrate 31. A photosensitive acrylic resin is used for the photosensitive resin layer 34. Materials similar to those used in Examples 1 and 2 can also be used. Thereafter, when the back surface of the supporting substrate 31, on which the shading layer 32 has been formed, is illuminated with light from a mercury lamp with a power output of 1 kW, which is collimated into substantially parallel light beams by means of a condenser lens, for 10 minutes, so that the photosensitive resin layer 34 is exposed to the light with the use of the shading layer 32 as a mask, then the exposed portions of the photosensitive resin layer 34 swell into the shape of convex lenses as shown in FIG. 3*e*, resulting in a microlens array 30. In this Example, the shading layer 32 and the photosensitive resin layer 34 are not in close contact with each other, but they interpose the transparent supporting substrate 31 therebetween, so that the exposed pattern drawn on the photosensitive resin layer 34 is a blurred copy of the pattern of the shading layer 32 which serves as a mask. In this Example, therefore, the amount of the photosensitive resin reacted varies depending upon the thickness of the supporting substrate, the degree of parallelism of light beams, and the exposure conditions (e.g., the intensity of light and the exposure time), as well as the thickness of the photosensitive resin layer, so that a desired microlens array can be obtained by controlling these factors.

Also, although the photosensitive resin layer 34 is formed after the formation of the shading layer 32 in Example 3, the photosensitive layer 34 can be formed first. However, it is preferable to proceed in the order described in this Example.

Although the arrays of spherical lenses are produced in Examples 1, 2, and 3, this invention is not restricted thereto and can also be applied to the production of arrays of cylindrical lenses, lenticular lenses, rectangular lenses, hexagonal lenses, or the like.

EXAMPLE OF USE

Figure 5:
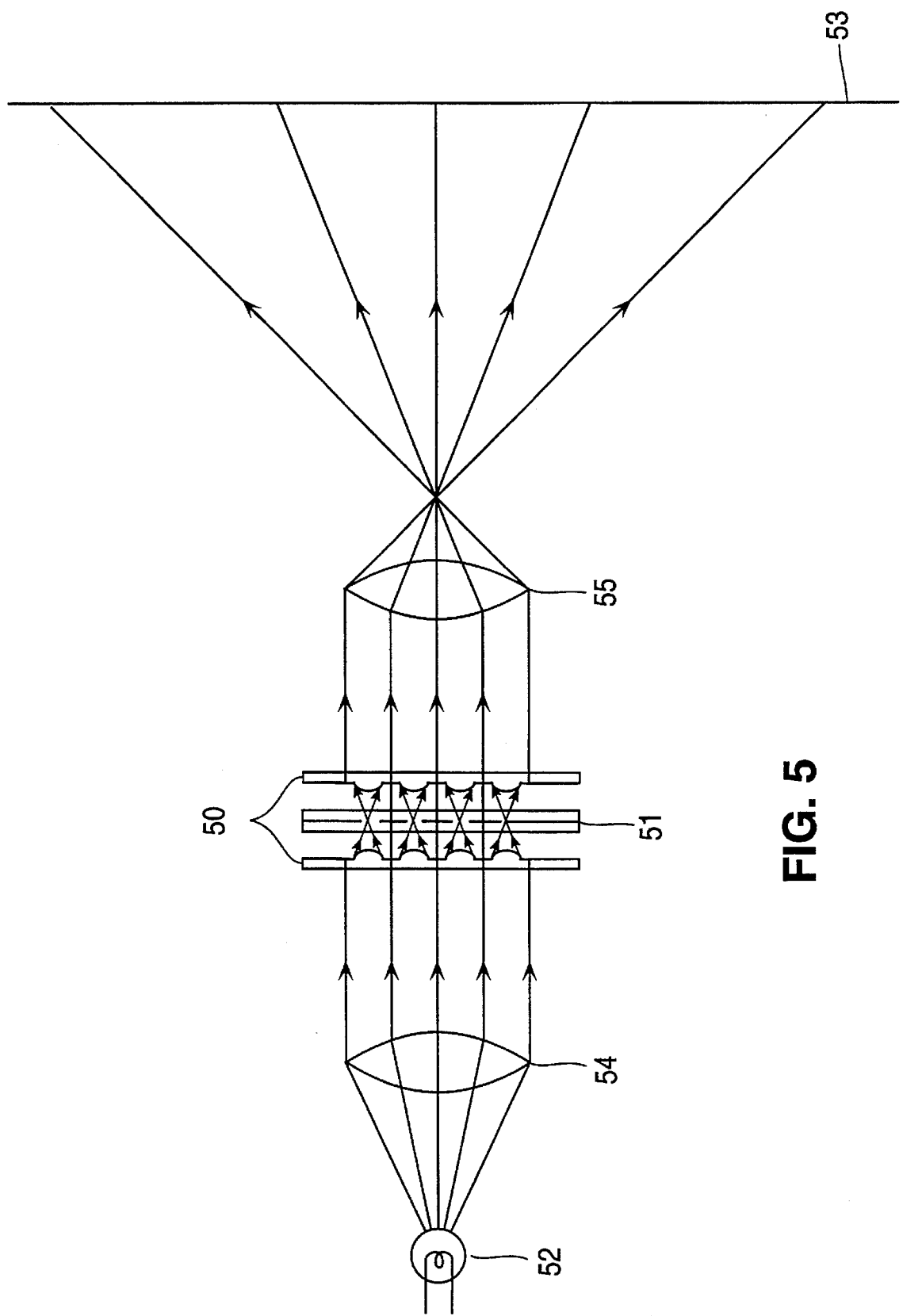
FIG. 5 is a schematic diagram showing a liquid crystal projection display device using a microlens array of this invention.

FIG. 5 shows a liquid crystal projection display device using a microlens array of this invention. A pair of microlens arrays 50 are arranged on both sides of a liquid crystal display panel 51. These microlens arrays 50 and the liquid crystal display panel 51 are arranged between a light source 52 and a screen 53. Moreover, a condenser lens 54 is arranged between the microlens arrays 50 and the light source 52 and a projector lens 55 is arranged between the microlens array 50 and the screen 53. When a microlens array of this invention is used, the availability of light from the light source 52 is improved, so that the brightness of the projected image is increased and the contrast of the projected image is increased because of a decrease of stray light, resulting in a display easier to see. Although the convex surface of the microlens arrays 50 is directed to the liquid crystal display panel 51 in this example, no significant difference was observed when this direction was reversed.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A microlens array comprising a supporting substrate, a light condensing layer having a plurality of microlenses which is disposed on said supporting substrate., and a shading layer having a plurality of openings which is disposed on said light condensing layer, each of said microlenses being arranged so as to condense light through a corresponding opening of said shading layer, said light condensing layer comprising a photosensitive resin layer, said microlenses being defined at each corresponding opening portion of said shading layer by said shading layer serving as a mask; and wherein the microlenses are provided with an interval therebetween.

2. A microlens array comprising a supporting substrate, a light condensing layer having a plurality of microlenses which is disposed on one surface of said supporting substrate, and a shading layer having a plurality of openings which is disposed on the other surface of said supporting substrate, each of said microlenses being arranged in contact with each other so as to condense light through a corresponding opening of said shading layer.., said light condensing layer comprising a photosensitive resin layer, said microlenses being defined at each corresponding opening portion of said shading layer by said shading layer serving as a mask; and wherein the microlenses are provided with an interval therebetween.

3. A microlens array according to claim 1, wherein said microlenses are those selected from the group consisting of spherical lenses, cylindrical lenses, lenticular lenses, rectangular lenses, and hexagonal lenses.

4. A microlens array according to claim 2, wherein said microlenses are those selected from the group consisting of spherical lenses, cylindrical lenses, lenticular lenses, rectangular lenses, and hexagonal lenses.

* * * * *